(12) United States Patent
Avci et al.

(10) Patent No.: US 10,553,694 B2
(45) Date of Patent: Feb. 4, 2020

(54) TRANSISTORS WITH TEMPERATURE COMPENSATING GATE STRUCTURES

(71) Applicant: INTEL CORPORATION, Santa Clara, CA (US)

(72) Inventors: Uygar E. Avci, Portland, OR (US); Daniel H. Morris, Hillsboro, OR (US); Ian A. Young, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/474,874

(22) PCT Filed: Apr. 11, 2017

(86) PCT No.: PCT/US2017/027030
§ 371 (c)(1),
(2) Date: Jun. 28, 2019

(87) PCT Pub. No.: WO2018/190811
PCT Pub. Date: Oct. 18, 2018

(65) Prior Publication Data
US 2019/0355826 A1 Nov. 21, 2019

(51) Int. Cl.
*H01L 29/49* (2006.01)
*H01L 29/423* (2006.01)
(Continued)

(52) U.S. Cl.
CPC .... *H01L 29/4958* (2013.01); *H01L 29/42392* (2013.01); *H01L 29/4966* (2013.01);
(Continued)

(58) Field of Classification Search
None
See application file for complete search history.

(56) References Cited

U.S. PATENT DOCUMENTS

2005/0280099 A1 12/2005 Park et al.
2007/0184621 A1 8/2007 Chidambarrao et al.
(Continued)

FOREIGN PATENT DOCUMENTS

WO 2018190811 A1 10/2018

OTHER PUBLICATIONS

International Search Report and Written Opinion received for PCT Application No: PCT/US2017/027030. dated Jan. 11, 2018. 10 pages.
(Continued)

*Primary Examiner* — Jack S Chen
(74) *Attorney, Agent, or Firm* — Finch & Maloney PLLC

(57) ABSTRACT

Techniques are disclosed for forming semiconductor integrated circuits including a channel region, a gate dielectric between the gate electrode and the channel region, a first layer between the gate dielectric and the gate electrode, the first layer comprising temperature compensation material. In addition, the integrate circuit includes a source region adjacent to the channel region, a source metal contact on the source region, a drain region adjacent to the channel region, and a drain metal contact on the drain region. The temperature compensation material has a temperature dependent band structure, work-function, or polarization that dynamically adjusts the threshold voltage of the transistor in response to increased operating temperature to maintain the off-state current $I_{off}$ stable or otherwise within an acceptable tolerance. The temperature compensation material may be used in conjunction with a work function material to help provide desired performance at lower or non-elevated temperatures.

20 Claims, 10 Drawing Sheets

(51) Int. Cl.
*H01L 29/78* (2006.01)
*H01L 29/40* (2006.01)
*H01L 29/66* (2006.01)

(52) U.S. Cl.
CPC ........ *H01L 29/7851* (2013.01); *H01L 29/401* (2013.01); *H01L 29/66545* (2013.01)

(56) References Cited

U.S. PATENT DOCUMENTS

| | | |
|---|---|---|
| 2007/0278583 A1 | 12/2007 | Luo et al. |
| 2009/0127551 A1* | 5/2009 | Imai ................. H01L 29/78696 257/43 |
| 2010/0308326 A1 | 12/2010 | Kim et al. |
| 2016/0126333 A1 | 1/2016 | Wei et al. |

OTHER PUBLICATIONS

Durakiewicz, et al., "Electronic work-function calculations of polycrystalline metal surfaces revisited," Physical Review B, vol. 64, 045101. Published Jun. 15, 2001. 8 pages.

* cited by examiner

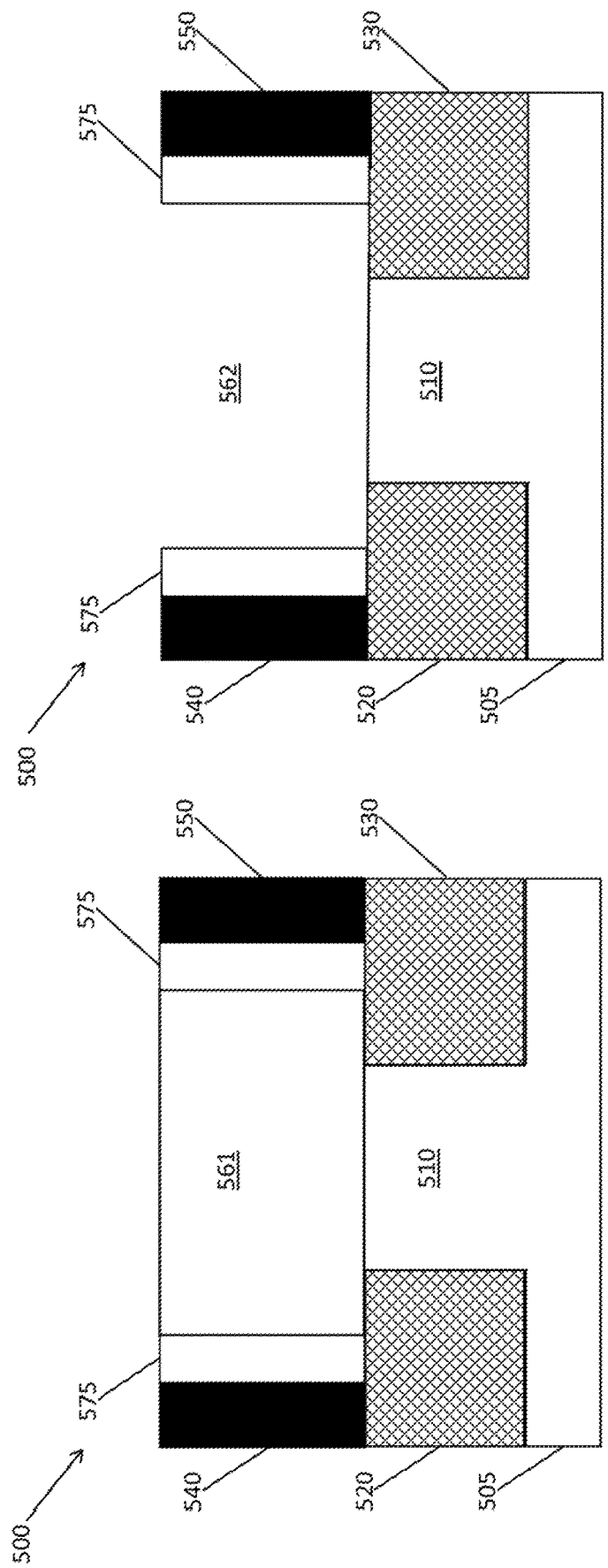

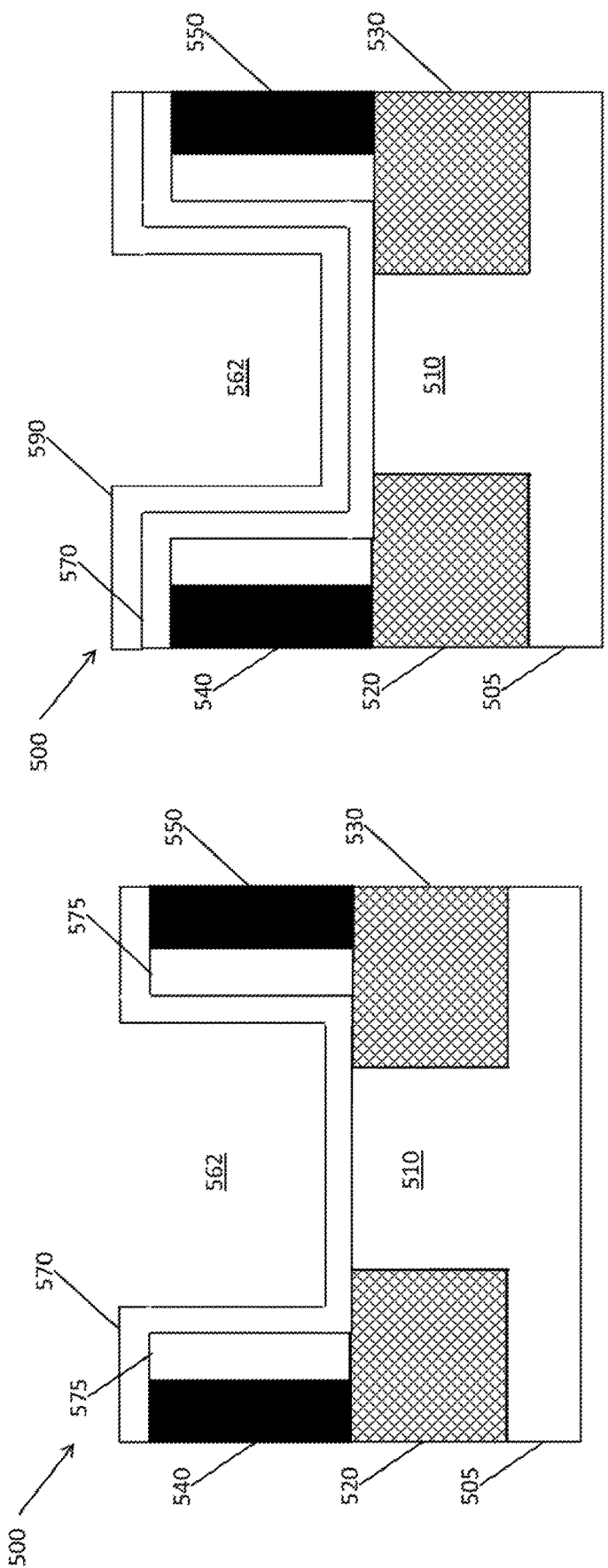

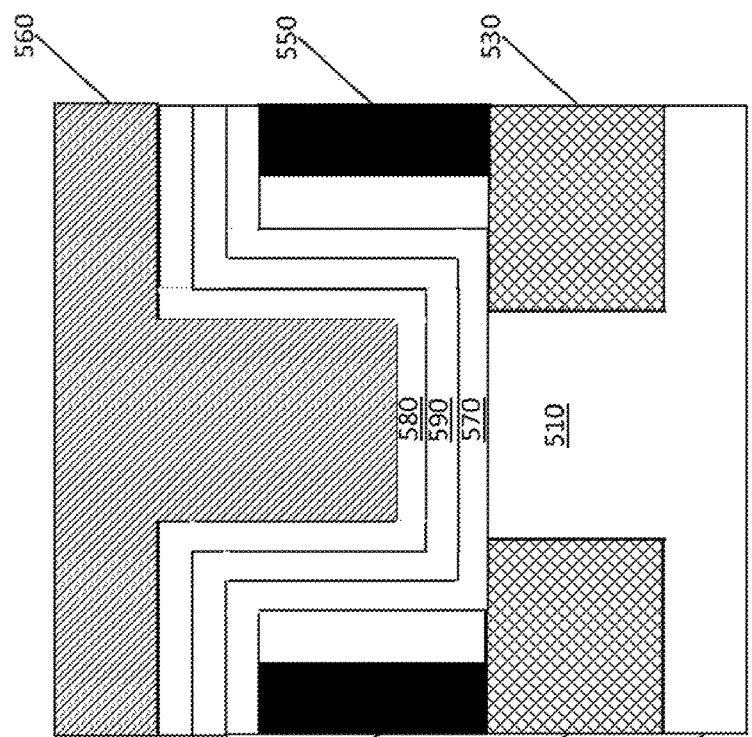
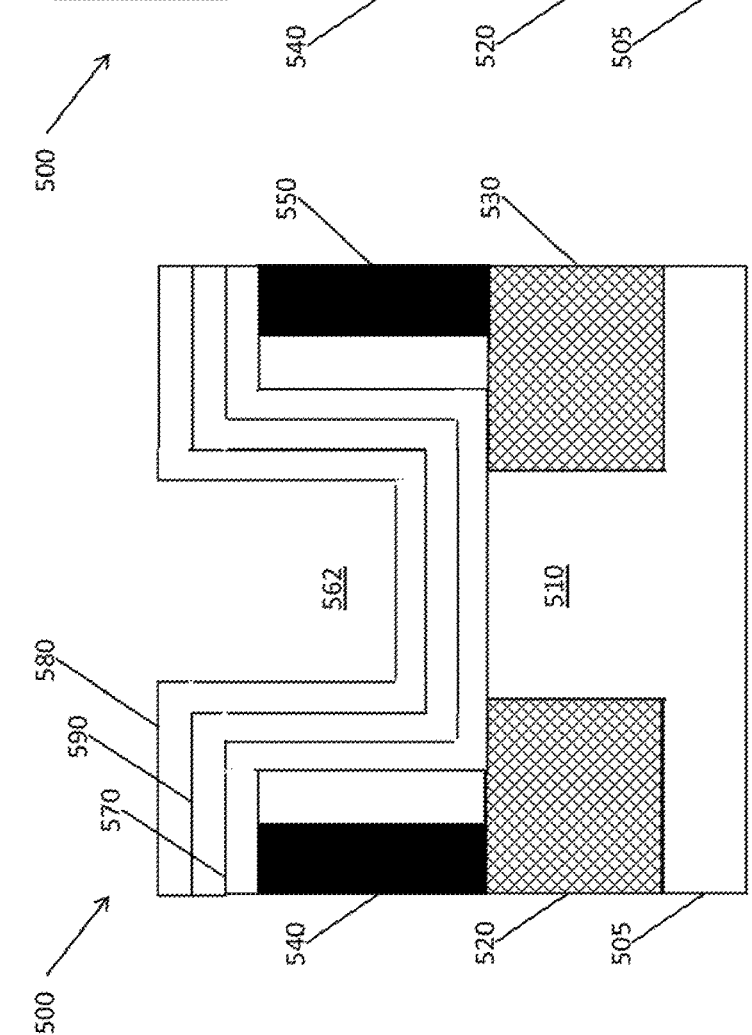
FIG. 5F
FIG. 5E

US 10,553,694 B2

TRANSISTORS WITH TEMPERATURE COMPENSATING GATE STRUCTURES

BACKGROUND

Increased performance of circuit devices including transistors, diodes, resistors, capacitors, and other passive and active electronic devices formed on a semiconductor substrate is typically a major factor considered during design, manufacture, and operation of those devices. For example, metal oxide semiconductor (MOS) transistor semiconductor transistor devices, such as those used in a complementary metal oxide semiconductor (CMOS), may operate or otherwise perform differently at temperatures higher than a nominal (25° C.) room temperature. Thus, devices designed for applications where higher than nominal temperature is possible may be designed with excess performance margin, so as to provide a desired albeit degraded level of performance under temperature.

BRIEF DESCRIPTION OF THE DRAWINGS

FIGS. 5A to 5G illustrate structures that are formed when carrying out the method of FIG. 4, in accordance to an embodiment of this disclosure.

Figure 1:
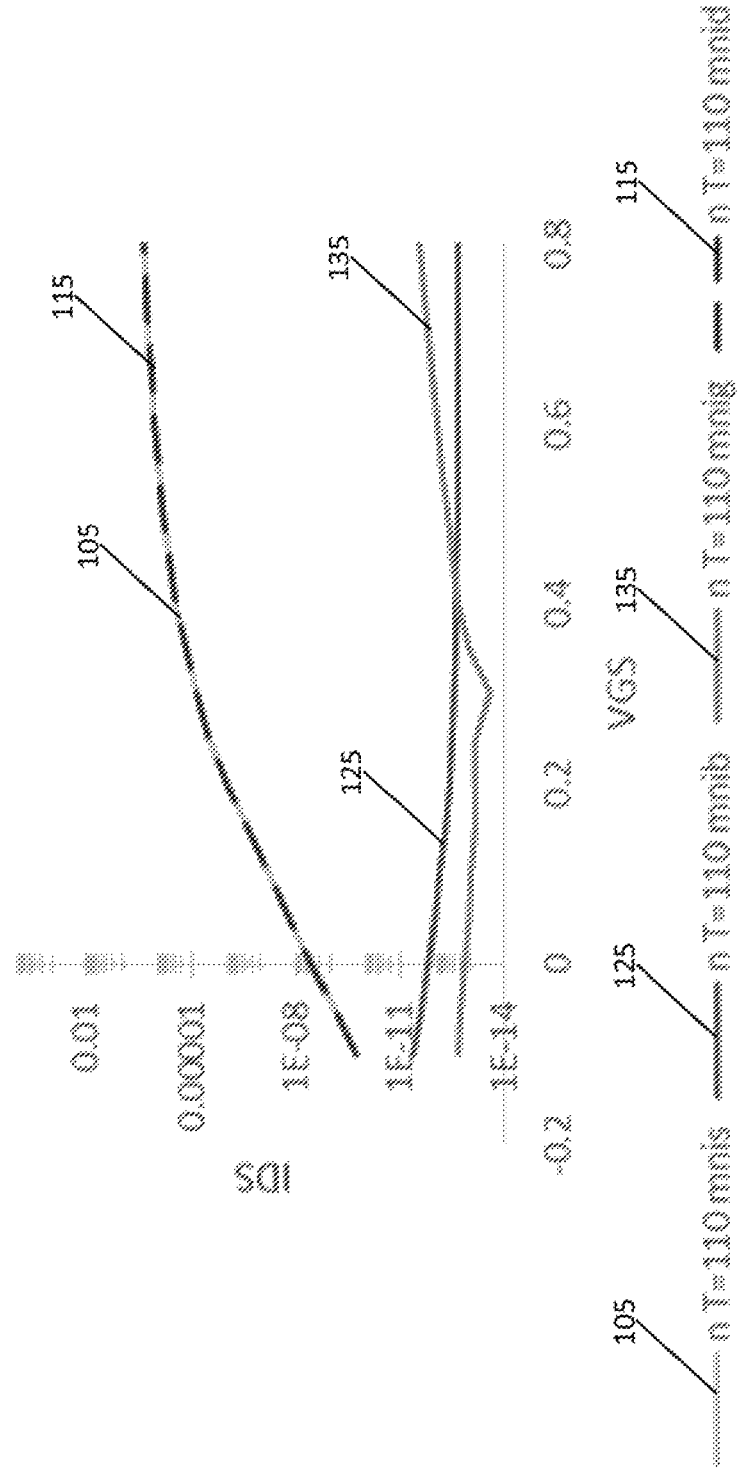
FIG. 1 is a plot of drain-source current (IDS) as a function of gate-source voltage (VGS) for a standard (nominal) MOSFET device operated at 110° C.

The figures depict various embodiments of the present disclosure for purposes of illustration only. In the drawings, each identical or nearly identical component that is illustrated in various figures may be represented by a like numeral. For purposes of clarity, not every component may be labeled in every drawing. As will be appreciated, the figures are not necessarily drawn to scale or intended to limit the present disclosure to the specific configurations shown. For instance, while some figures generally indicate straight lines, right angles, and smooth surfaces, an actual implementation of a transistor structure may have less than perfect straight lines, right angles, and some features may have surface topology or otherwise be non-smooth, given real world limitations of the processing equipment and techniques used. In short, the figures are provided merely to show example structures. Numerous variations, configurations, and other embodiments will be apparent from the following detailed discussion.

DETAILED DESCRIPTION

Techniques are disclosed for forming semiconductor integrated circuits including transistors having gate structures including a temperature compensation material. The temperature compensation material has a temperature dependent band structure, work-function, or polarization, thereby dynamically adjusting the threshold voltage ($V_T$) of the transistor in response to changes in operating temperature to maintain the off-state current ($I_{off}$) substantially constant or otherwise in an acceptable range. In more detail, a semiconductor integrated circuit configured in accordance with an embodiment includes a channel region, a gate dielectric between the gate electrode and the channel region, and a first layer between the gate dielectric and the gate electrode. The first layer comprises temperature compensation material. In addition, a source region is adjacent to the channel region, and a source metal contact is on the source region. Likewise, a drain region is adjacent to the channel region, and a drain metal contact is on the drain region. For NMOS transistors, the temperature compensation material includes, for example, at least one of Rubidium (Rb), Caesium (Cs), Iron (Fe), and Osmium (Os). For PMOS transistors, the temperature compensation material includes, for example, one or more of hafnium zirconate ($HfZrO_2$), barium titanate ($BaTiO_3$), bismuth ferrite ($BiFeO_3$), lead zirconate titanate ($PbZr_xTi_{(1-x)}O_3$), zinc oxide (ZnO), potassium niobate ($KNbO_3$), sodium tungstate ($Na_2WO_3$), bismuth titanate ($Bi_4Ti_3O_{12}$), gallium nitride (GaN), and aluminum nitride (AlN). In some embodiments, the compensation material may be coupled to or otherwise used in conjunction with a material having a gate work function suitable for the MOSFET device. Such an arrangement is particularly helpful if the compensation material does not have a room-temperature work function suitable for the target $I_{off}$ range.

The disclosed techniques may provide various advantages over standard MOSFETs, such as efficient integrated circuit operation over wider temperature ranges and improved performance and energy efficiency at room temperature. The techniques can be used with both planar and non-planar transistor architecture, including FinFETs (double-gate and tri-gate transistors) and nanowire or so-called gate-all-around configurations.

General Overview

As previously noted, it is sometimes necessary to operate integrated circuits at temperatures higher than nominal (25° C.) room temperature. The higher or elevated temperature may be a function of, for example, the environment (e.g., a very hot climate or room) and/or power dissipation of the circuit itself (e.g., higher current draw causes increased operating temperature). In any such cases, MOS field effect transistors (MOSFETs), may exhibit increased current leakage below their threshold voltage ($V_T$) at high temperature. As shown in FIG. 1, in a standard NMOS transistor at 110° C., current (IDS) 105 through the source and drain (105 and 115, respectively) is several orders of magnitude larger than the current through the body or the gate (125 and 135, respectively) of the device, at 0 $V_{GS}$, which is the off state, or standby mode of the device. This temperature-induced current leakage ($I_{off}$) in standby mode causes increased power consumption, which is particularly detrimental to battery powered device operation. Designing MOSFETs with higher $V_T$ to meet standby power budgets at high temperatures (e.g., temperatures up to 125° C., such as 110°

C.) is one possible solution to this problem, by design margining for a given high-temperature process, voltage and temperature (PVT) corner. Such design margining, however, increases power consumption and decreases performance of resulting integrated circuits. Embodiments of the present disclosure recognize this problem and are configured to help to mitigate or otherwise reduce temperature-induced current leakage, and may further allow for better power performance across a broader set of PVT corners.

Transistors with Temperature Compensating Gate Structures

Figure 2:
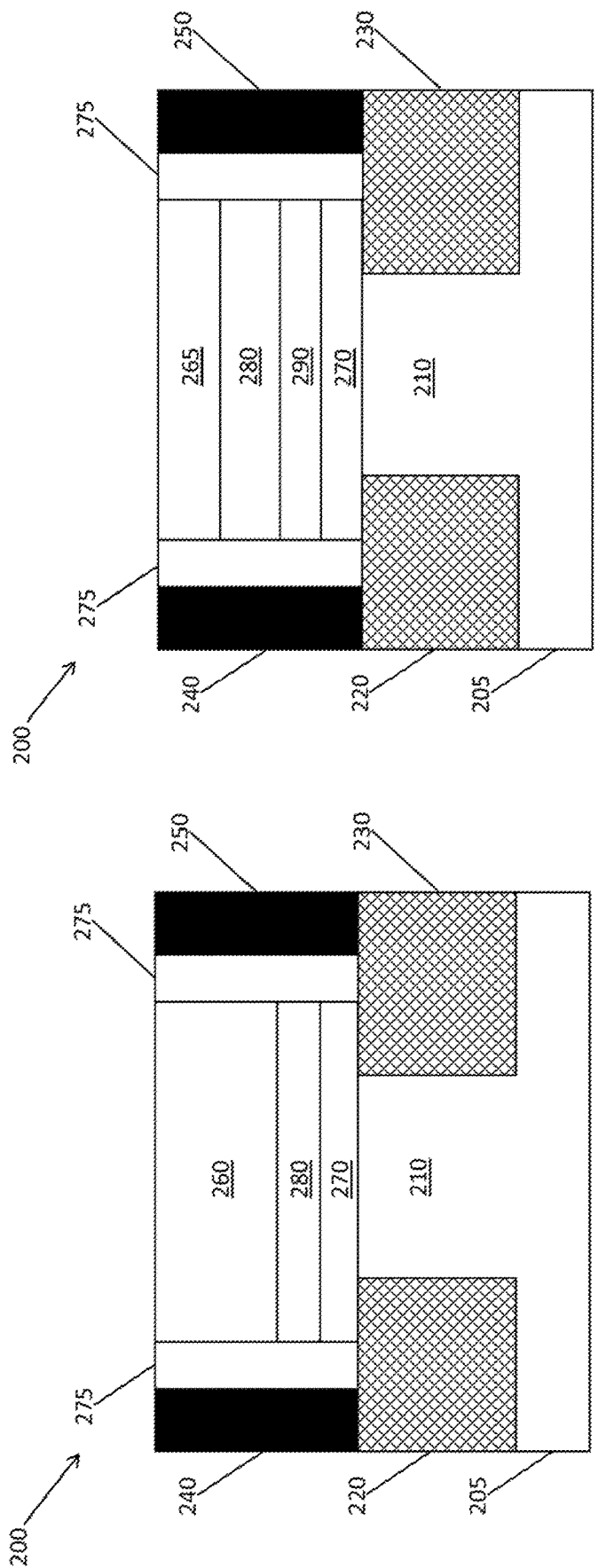
FIG. 2A is a schematic illustration of a semiconductor device including a layer or structure comprising temperature compensation material according to an embodiment of this disclosure.
FIG. 2B is a schematic illustration of a semiconductor device including a layer or structure comprising temperature compensation material according to another embodiment of this disclosure

In an embodiment according to this disclosure, shown in FIG. 2A, a MOS device, such as a PMOS or NMOS transistor 200 includes a channel region 210 formed in a semiconductor body or substrate 205. The semiconductor substrate 205 may be implemented, for example, with a bulk silicon or a silicon-on-insulator substrate configuration. In some implementations, the semiconductor substrate may be formed using crystalline silicon. In other implementations, the semiconductor substrate may be formed using alternate materials, which may or may not be combined with silicon, such as germanium, silicon germanium, indium antimonide, lead telluride, indium arsenide, indium phosphide, indium gallium arsenide, gallium arsenide, or gallium antimonide. In a more general sense, any material that may serve as a foundation upon which a semiconductor device may be built or otherwise formed can be used in accordance with embodiments of the present disclosure. The channel region 210 may be undoped or lightly doped, as the case may be.

With further reference to FIG. 2A, the transistor 200 further includes a source region 220 and a drain region 230, both adjacent to but on opposite sides of the channel region 210. The source 220 and drain 230 regions can be, for example, group IV semiconductor materials or group III-V semiconductor materials, and have any desired doping scheme/polarity (e.g., silicon or SiGe alloy, InGaAs, InAlAs, InGaSb, InSb, p-type and/or n-type).

With further reference to FIG. 2A, the transistor 200 further includes a source metal contact 240 on the source region 220, and a drain metal contact 250 on the drain region 230. The contacts 240 and 250 can be contact plugs or another suitable contact structure. In some example embodiments, the metal for the contact plugs 240 and 250 may include, for instance, aluminum, tungsten, copper, titanium, silver, nickel-platinum, nickel-aluminum, or any other suitably conductive contact metal or alloy. The contact metals can be provisioned using any number of standard deposition processes. In some cases, the source/drain contact structures 240 and 250 include multiple components, such as a liner or barrier layer, resistance reducing metal, work function metals, and a plug. Any number of such contact structures can be used, as will be appreciated.

With further reference to FIG. 2A, the transistor 200 further includes a gate stack (including gate dielectric 270 and electrode 260) above the channel region 210. In some embodiments, the gate electrode 260 may be a polysilicon or tungsten gate electrode. The gate electrode 260 may include multiple components in some embodiments, such as work function metals and/or barrier materials surrounding a metal core or plug. As can be seen, the gate dielectric 270 (which may be high-k gate dielectric material) is between the gate electrode 260 and the channel region 210. In one specific example case, the gate stack includes a silicon dioxide gate dielectric 270 and a polysilicon or tungsten gate electrode 260. In some embodiments, the gate dielectric 270 includes multiple components such as a lower layer of silicon dioxide on the channel region 210, and an upper layer of hafnium oxide on the silicon dioxide layer. Example materials or material combinations include a single material structure such as silicon dioxide, silicon oxy-nitride, silicon nitride, or carbon-doped silicon nitride. Other example materials or material combinations include a multi-layer stack having a lower portion silicon dioxide, silicon oxy-nitride, silicon nitride, or carbon-doped silicon nitride and an upper portion higher dielectric constant material such as hafnium oxide. Other examples of high-k gate dielectric materials include, for instance, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate.

With further reference to FIG. 2A, the transistor 200 further includes gate spacers 275 formed on either side of the gate stack that isolate the gate electrode 260 from the doped source region 220 and source metal contact 240, and from the doped drain region 230 and drain metal contact 250. The gate spacers 275 may be formed, for example, using standard gate spacer materials such as silicon dioxide, silicon nitride, or other suitable spacer materials. The width of the gate spacers 275 may generally be chosen based on design requirements for the transistor being formed. In the embodiment shown, note that the source/drain regions 220/230 are under both the gate spacers 275 and the gate dielectric 270. In other embodiments, the source/drain regions 220/230 may be under only the gate spacers 275, or neither of the gate spacers 275 or the gate dielectric 270.

Figure 3:
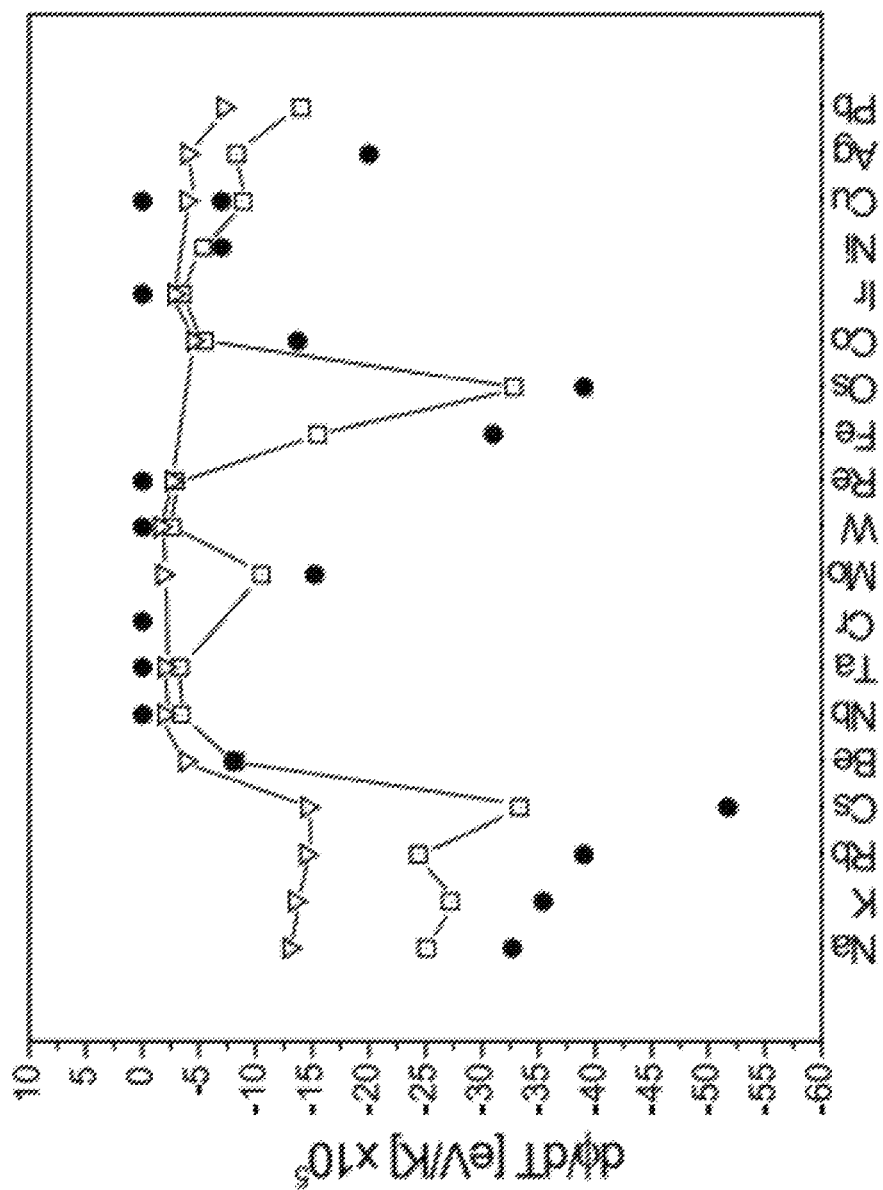
FIG. 3 is a plot of the change in work-function as a function of temperature (dϕ/dT) in eV/K for several elements of the periodic table.

With further reference to FIG. 2A, the gate stack of the transistor 200 further includes a first layer 280 between the gate dielectric 270 and the gate electrode 260, the first layer 280 comprising temperature compensation material. In some embodiments, the compensation material has a band structure that dynamically changes in response to temperature. The work-function of a metal depends on its band structure and its interaction with the gate dielectric 270 interface. For temperature-compensated NMOS transistors, for instance, the temperature compensation material includes a metal that exhibits a lower work-function at higher temperatures, such as at least one of Rubidium (Rb), Caesium (Cs), Iron (Fe), and Osmium (Os). As shown in FIG. 3, these metals have a negative $d\phi/dT$ (change in work-function with temperature (eV/K)). With further reference to FIG. 3, the solid circles are experimental results, and the open squares and open triangles are calculated values. See T. Durakiewicz, A. J. Arko, J. J. Joyce, D. P. Moore, and S. Halas, Surface Science vol. 478 pp. 72-82 (2001), and Ref [3] cited therein, the contents of which are hereby incorporated by reference in their entirety for all purposes. For PMOS transistors, the temperature compensation material includes, for example, a ferroelectric material that exhibits a change in polarization in response to temperature, such as at least one of $HfZrO_2$, $BaTiO_3$, $BiFeO_3$, $PbZr_xTi_{(1-x)}O_3$, or a piezoelectric material that exhibits a reduction in potential (V) in response to temperature, such as at least one of $ZnO$, $KNbO_3$, $Na_2WO_3$, $Bi_4Ti_3O_{12}$, $GaN$, and $AlN$. Any suitable deposition techniques can be used to provide the first layer 280, including chemical vapor deposition (CVD), atomic layer deposition (ALD), spin-on deposition (SOD), or physical vapor deposition (PVD). The thickness of the first layer 280 (between gate dielectric 270 and gate electrode 260) can vary from one embodiment to the next, but in some embodiments is in the range of 2 nm to 50 nm (such as 5 nm, 10 nm, 20 nm, 25 nm, 30 nm, 35 nm, 40 nm, or 45 nm thick). In some embodiments, the thickness of the first layer 280 and the thickness of the gate dielectric 270 are about the same (e.g., 5 nm to 20 nm). In a more general sense, the first layer 280 may be provided using any suitable techniques and at any thickness level. Further note first layer 280 may actually include multiple temperature compensation materials and/or sub-layers of temperature compensation material in a stacked or multi-layer configuration. Numerous such configurations will be apparent in light of this disclosure.

In some embodiments, as shown in FIG. 2B, the transistor 200 further includes a second layer 290 between the gate dielectric 270 and the first layer 280. The second layer 290 comprises a gate work-function metal that has a room temperature work-function suitable for a desired $I_{off}$ of a MOSFET device, such as at least one of tungsten (W), tantalum (Ta), and titanium nitride (TiN). In certain embodiments, as shown in FIG. 2B, the gate electrode 265 comprises a low resistance gate metal, such as copper or aluminum. The thickness of the second layer 290 (between the gate dielectric 270 and the first layer 280) can vary from one embodiment to the next, but in some embodiments is in the range of 2 nm to 50 nm (such as 5 nm, 10 nm, 20 nm, 25 nm, 30 nm, 35 nm, 40 nm, or 45 nm thick). In some embodiments, the thickness of each of the second layer 290, the first layer 280, and the gate dielectric 270 is about the same (e.g., 5 nm to 20 nm). In a more general sense, the second layer 290 may be provided using any suitable techniques and at any thickness level. Further note second layer 290 may actually include multiple work function materials and/or sub-layers of work function material in a stacked or multi-layer configuration. Numerous such configurations will be apparent in light of this disclosure.

Methodology and Architecture

Figure 4:
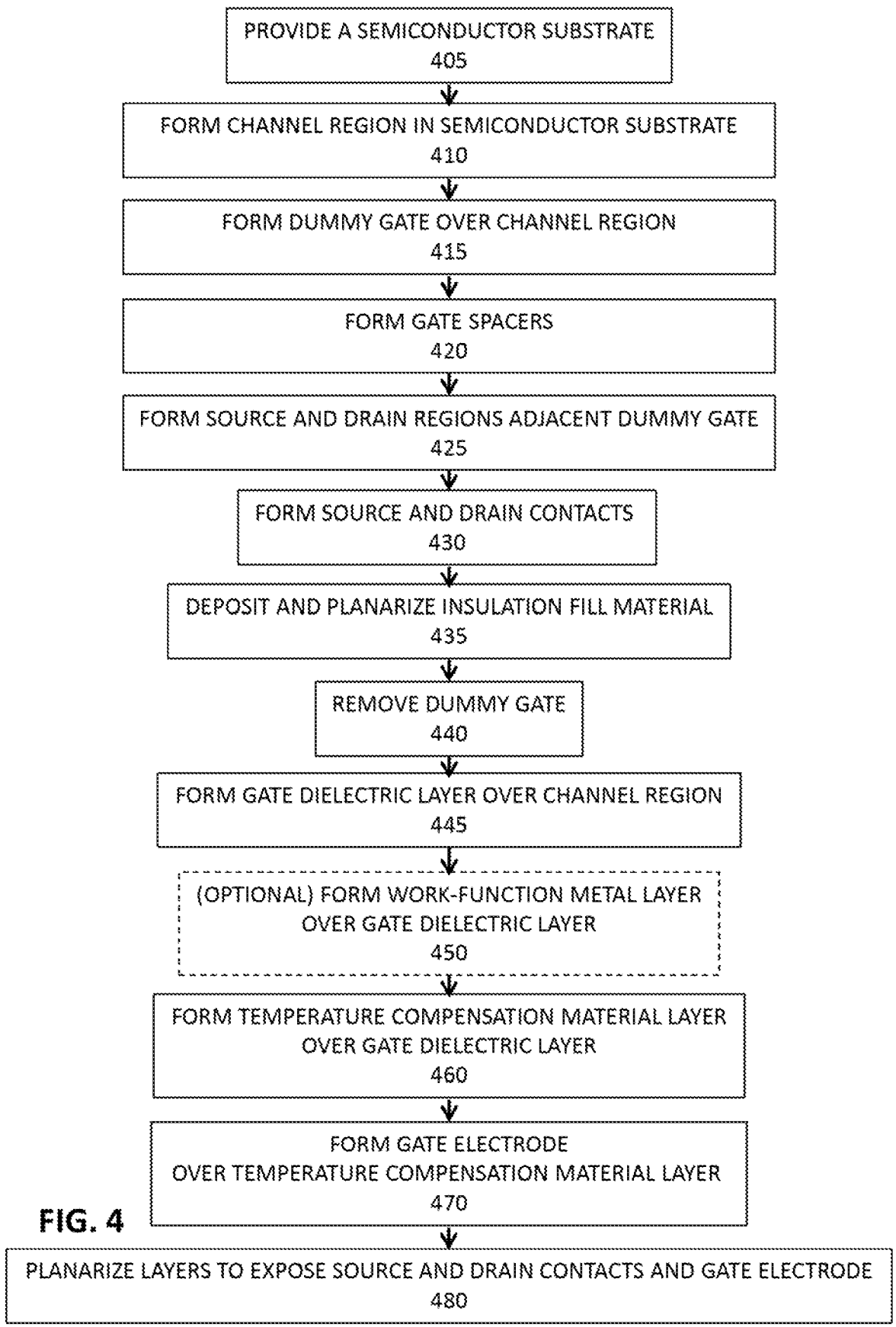
FIG. 4 is a method for forming a transistor structure including a layer or structure of temperature compensation material according to an embodiment of this disclosure.
Figure 5G:
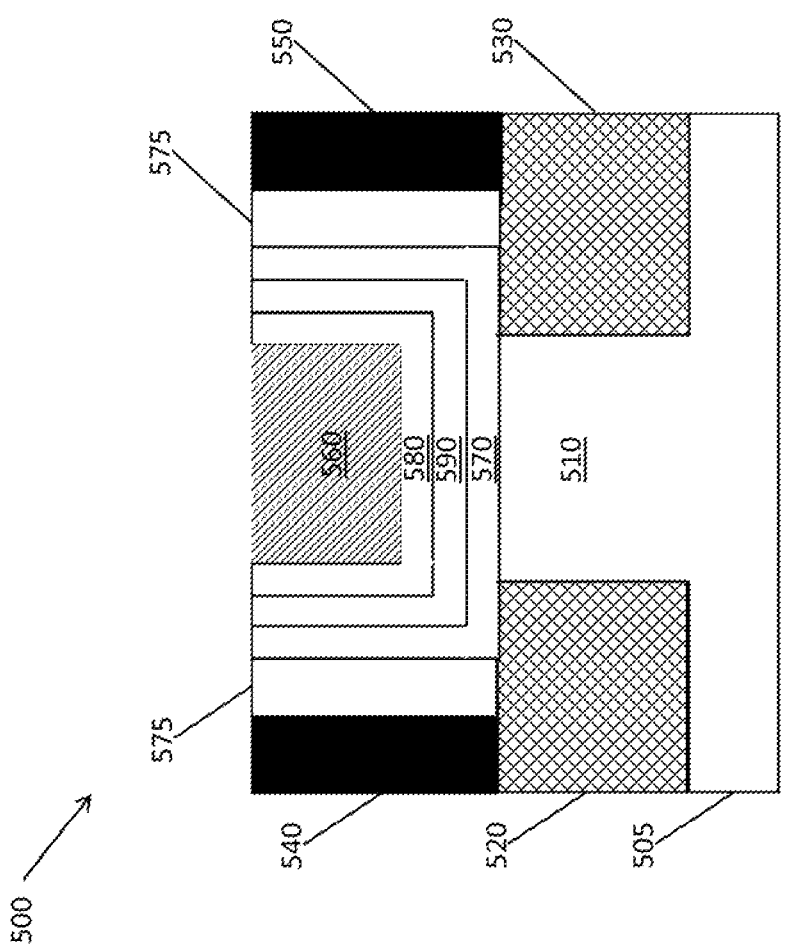

FIG. 4 is a method for forming a semiconductor integrated circuit including a transistor structure comprising a layer or structure of temperature compensation material between the gate dielectric and the gate electrode in accordance with an embodiment of the present disclosure. FIGS. 5A through 5G illustrate example structures that are formed as the method is carried out, and in accordance with some embodiments. As can be seen, the method includes providing 405 a semiconductor substrate 505, as shown in FIG. 5A, upon which a MOS device 500, such as a PMOS or NMOS transistor, may be formed. The method further includes forming 410 a channel region 510 in the substrate 505, followed by forming 415 a dummy gate structure 561 over the channel region 510, followed by forming 420 gate spacers 575, followed by forming 425 the source 520 and drain 530 regions. Any suitable standard or custom processes can be used in forming these various features of transistor 500. As will be appreciated, this embodiment employs a gate last or so-called RMG (replacement metal gate) process, such that the final gate materials are added later in the process and therefore are not subjected to source/drain processing (which may involve temperatures not conducive to final gate materials). As will be further appreciated, the method further includes forming 430 the source contact 540 and drain contact 550 after deposition of an insulator fill material and planarization process, wherein source/drain contact trenches are formed in the insulator fill material over the source/drain regions 520/530 and the source contact 540 and the drain contact 550 are then deposited into those trenches. The previous relevant discussion with respect to the substrate 205, source 220, drain 230, and channel 210 regions, source 240 and drain 250 contacts, and gate spacers 275 is equally applicable here as will be appreciated, and not all details and variations are repeated for sake of brevity. The sacrificial gate 561 can be made of any material that can subsequently be removed, such as, for example, polysilicon. In other embodiments, a gate first process can be used, wherein a final gate structure is formed instead of a dummy gate structure. An example final gate structure is described with reference to FIGS. 5C-5F. Whether contacts are formed at the end of the process or earlier can be determined based on the thermal budgets and constraints of the various materials already provisioned, as will be appreciated. For example, if one or more of the final gate stack materials would be damaged by the contact forming process (e.g., due to high temperature used in the process, such as for silicidation), then the contacts can be formed before the final gate structure is provisioned.

With further reference to FIG. 4, the method further includes removing 440 the sacrificial gate 561. A standard process may be carried out to etch away the sacrificial gate 561 to form the cavity 562 shown in FIG. 5B. A hardmask can be used to protect the source and drain contacts 540 and 550 and gate spacers 575 while the sacrificial gate materials are etched away or otherwise removed.

With further reference to FIG. 4, the method further includes forming 445 the gate dielectric 570 over the channel region 510 and the source 520 and drain 530 regions, as shown in FIG. 5C. The gate dielectric 570 can be formed as typically done or using any suitable custom techniques. For instance, in one example case, the gate dielectric 570 may be blanket deposited, as shown in FIG. 5C, onto the semiconductor substrate, gate spacers 575, and other exposed features (e.g., source/drain contacts if present, insulation fill material) of the structure using standard deposition processes such as CVD, ALD, SOD, or PVD. Alternate deposition techniques may be used as well, for instance, the gate dielectric 270 or a portion thereof may be thermally grown. The previous relevant discussion with respect to the gate dielectric 270 is equally applicable here as will be appreciated, and not all details and variations are repeated for sake of brevity.

With further reference to FIG. 4, the method optionally further includes forming 450 a work-function metal layer 590 over the gate dielectric 570. The work-function metal layer 590 can be formed using any standard or custom techniques. For instance, in one example case, the work-function metal layer 590 may be blanket deposited, as shown in FIG. 5C, onto the underlying gate dielectric 570 using standard deposition processes such as CVD, ALD, or PVD. The previous relevant discussion with respect to the work-function metal layer 290 is equally applicable here as will be appreciated, and not all details and variations are repeated for sake of brevity.

With further reference to FIG. 4, the method further includes forming 460 a temperature compensation material layer 580 over the optional work-function metal structure 590 (if present) or the gate dielectric 570, as shown in FIG. 5E. Standard deposition processes such as CVD, ALD, or PVD suitable for blanket depositing the temperature compensation materials described above in relation to temperature compensation material layer 280 can be used to form the temperature compensation material layer 580. The previous relevant discussion is equally applicable here.

With further reference to FIG. 4, the method further includes forming 470 a gate electrode 560 over the temperature compensation material layer 580, as shown in FIG. 5F. Standard deposition processes such as CVD, ALD, or PVD suitable for blanket depositing the gate electrode materials described above in relation to gate electrode 260 can be used to form the gate electrode 560. The previous relevant discussion is equally applicable here. Recall the gate electrode 560 may be a multicomponent structure, including liner or barrier layers, work function tuning layers, and/or plug material.

With further reference to FIG. 4, the method further includes planarizing 480 the deposited structures 560, 580, 590, and 570 to remove excess materials provided by earlier processing and expose source contact 540, drain contact 550, and gate electrode 560. The planarizing can be carried out, for example, by chemical mechanical polishing/planarizing (CMP), stopping on exposure of the source and drain metal contacts 540 and 550 (if present), gate electrode 560, and/or gate spacers 575, as shown in FIG. 5G, to form the MOS structure or device 500.

Note the cross-sections shown in FIGS. 5A through 5G can refer to either planar or non-planar transistor structures, which happen to look alike in the given cross-sections. The cross-sections are taken through a vertical plane passing through each of the source, channel, and drain regions. If the structure 500 is a fin-based transistor, the cross-section is taken parallel to and through the semiconductor fin or body. The fin may be native to the substrate 510 (formed from the substrate 510), or may be a substitute fin having material that is different from the substrate 510 material. Likewise, note that the channel region 510 may be formed to include one or more nanowires or ribbons in a gate-all-around configuration, as is sometimes done. Further note that the source/drain regions 520/530 can be provided by any number of processes, including ion implantation into the substrate at the source/drain region locations, or an etch and replace process wherein the source/drain region 520/530 material is different from the substrate 510 material. In some embodiments, the source/drain regions 520/530 may include one or more nanowires or ribbons. As will be appreciated in light of this disclosure, any such transistor configurations can benefit from having temperature compensation material provided in the gate structure, as variously provided herein.

Simulation Results

Figure 6:
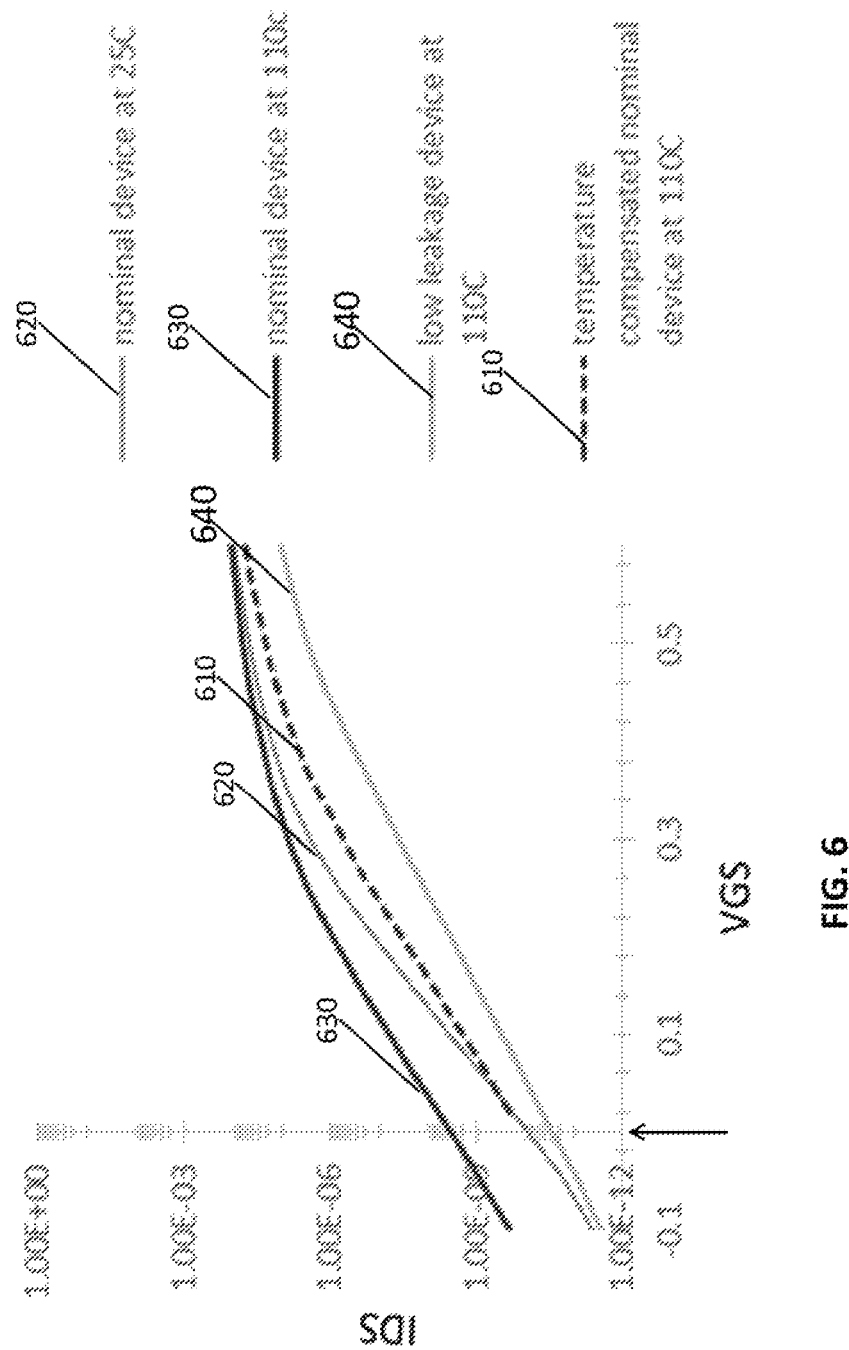
FIG. 6 is a plot of simulation results of drain-source current (IDS) as a function of gate-source voltage (VGS) for a MOSFET device configured according to an embodiment of this disclosure.

As shown in FIG. 6, a simulated device according to an embodiment of this disclosure having a work-function adjusted by 120 mV in response to an 85° C. increase in temperature (from 25° C. to 110° C.) shows MOSFET current-voltage (IV) curve 610, that is comparable in current leakage (at 0 VGS indicated by arrow) to a standard (nominal) device curve 620 at 25° C., and almost 100 times lower in current leakage than a standard (nominal) device curve 630 at 110° C. The MOSFET IV curve 640 of a low leakage but also low performance device at 110° C. is also shown in FIG. 6 for comparison.

Use of the techniques and structures provided herein may be detectable using tools such as: electron microscopy including scanning/transmission electron microscopy (SEM/TEM), scanning transmission electron microscopy (STEM), and reflection electron microscopy (REM); composition mapping; x-ray crystallography or diffraction (XRD); energy-dispersive x-ray spectroscopy (EDS); secondary ion mass spectrometry (SIMS); time-of-flight SIMS (ToF-SIMS); atom probe imaging or tomography; local electrode atom probe (LEAP) techniques; 3D tomography; or high resolution physical or chemical analysis, to name a few suitable example analytical tools. In particular, in some example embodiments, such tools may indicate the presence of transistors having gate structures including a temperature compensation material in a semiconductor integrated circuit, between the gate dielectric and the gate electrode. In some embodiments, note that the temperature compensation material may appear to be part of a multi-component gate dielectric structure or part of a multi-component gate electrode structure. In still other embodiments, note that the temperature compensation material may appear to be part of a multi-component gate work function tuning structure.

Example System

Figure 7:
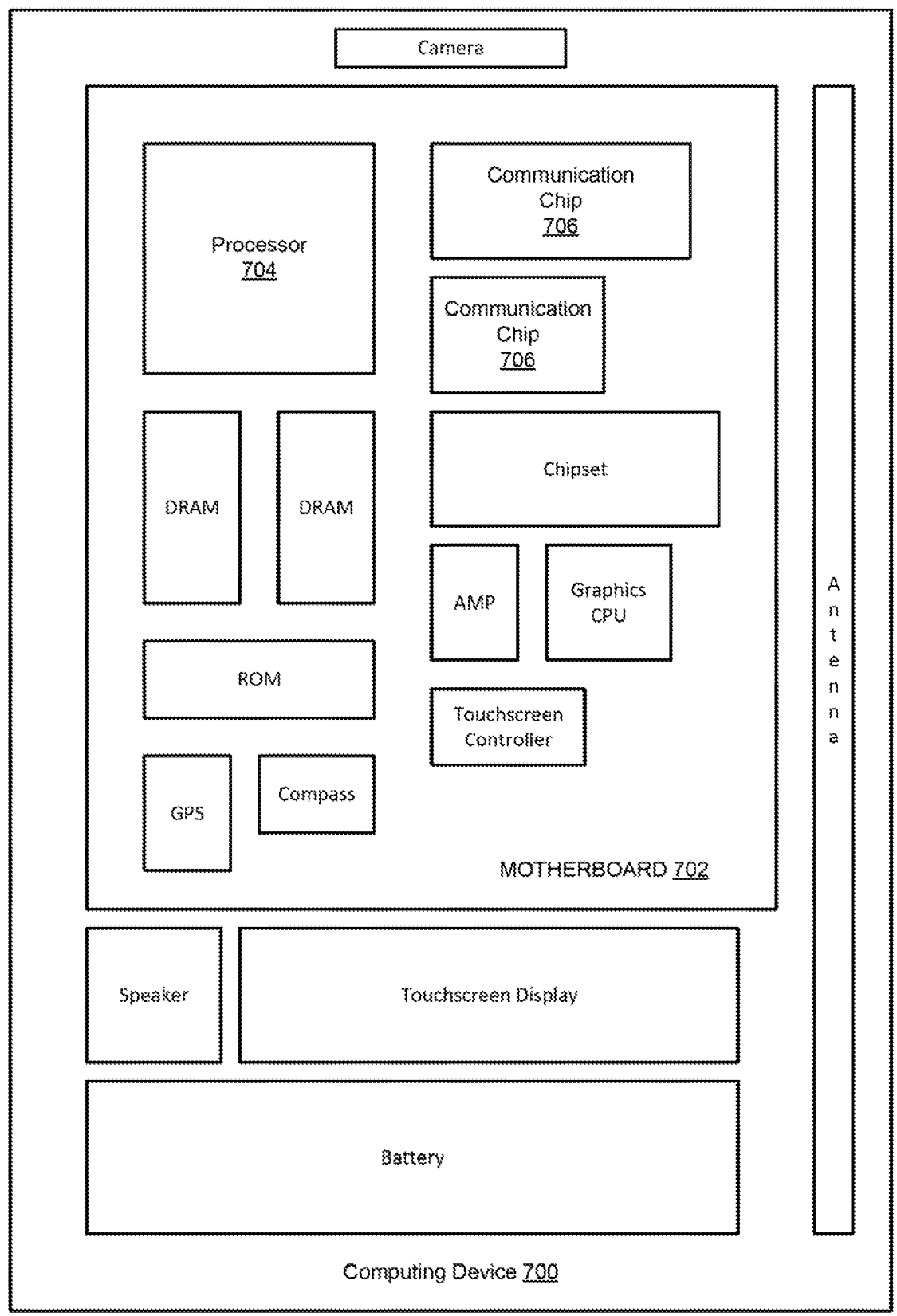
FIG. 7 is a depiction of a computing system configured according to an embodiment of this disclosure.

FIG. 7 is an example computing system implemented with one or more of the integrated circuit structures as disclosed herein, in accordance with some embodiments of the present disclosure. As can be seen, the computing system 700 houses a motherboard 702. The motherboard 702 may include a number of components, including, but not limited to, a processor 704 and at least one communication chip 706, each of which can be physically and electrically coupled to the motherboard 702, or otherwise integrated therein. As will be appreciated, the motherboard 702 may be, for example, any printed circuit board, whether a main board, a daughterboard mounted on a main board, or the only board of system 700, etc.

Depending on its applications, computing system 700 may include one or more other components that may or may not be physically and electrically coupled to the motherboard 702. These other components may include, but are not limited to, volatile memory (e.g., DRAM), non-volatile memory (e.g., read only memory (ROM)), a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth). Any of the components included in computing system 700 may include one or more integrated circuit structures or devices configured in accordance with an example embodiment (e.g., to include one or more transistors having gate structures including a temperature compensation material, as variously provided herein). In some embodiments, multiple functions can be integrated into one or more chips (e.g., for instance, note that the communication chip 706 can be part of or otherwise integrated into the processor 704).

The communication chip 706 enables wireless communications for the transfer of data to and from the computing system 700. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 706 may implement any of a number of wireless standards or protocols, including, but not limited to, Wi-Fi (Institute of Electrical and Electronics Engineers (IEEE) 802.11 family), worldwide interoperability for microwave access (WiMAX) (IEEE 802.16 family), IEEE 802.20, long term evolution (LTE), 1x evolution-data optimized (Ev-DO), high speed packet access (HSPA+), high speed downlink packet access (HSDPA+), high speed uplink packet access (HSUPA+), enhanced data rates for GSM evolution (EDGE), global system for mobile communication (GSM), general packet radio service (GPRS), code division multiple access (CDMA), time division multiple access (TDMA), digital enhanced cordless telecommunications (DECT), Bluetooth, derivatives thereof, as well as any other wireless protocols that are designated as 3G, 4G, 5G, and beyond. The computing system 700 may include a plurality of communication chips 706. For instance, a first communication chip 706 may be dedicated to shorter range wireless communications such as Wi-Fi and Bluetooth and a second communication chip 706 may be dedicated to longer range wireless communications such as GPS, EDGE, GPRS, CDMA, WiMAX, LTE, Ev-DO, and others. In some embodiments, communication chip 706 may include one or more transistor structures having transistors having gate structures including a temperature compensation material as variously described herein.

The processor 704 of the computing system 700 includes an integrated circuit die packaged within the processor 704. In some embodiments, the integrated circuit die of the processor includes onboard circuitry that is implemented with one or more integrated circuit structures or devices as variously described herein. The term "processor" may refer to any device or portion of a device that processes, for instance, electronic data from registers and/or memory to transform that electronic data into other electronic data that may be stored in registers and/or memory.

The communication chip 706 also may include an integrated circuit die packaged within the communication chip 706. In accordance with some such example embodiments, the integrated circuit die of the communication chip includes one or more integrated circuit structures or devices as variously described herein. As will be appreciated in light of this disclosure, note that multi-standard wireless capability may be integrated directly into the processor 704 (e.g., where functionality of any chips 706 is integrated into processor 704, rather than having separate communication chips). Further note that processor 704 may be a chip set having such wireless capability. In short, any number of processor 704 and/or communication chips 706 can be used. Likewise, any one chip or chip set can have multiple functions integrated therein.

In various implementations, the computing system 700 may be a laptop, a netbook, a notebook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, a digital video recorder, or any other electronic device that processes data or employs one or more integrated circuit structures or devices formed using the disclosed techniques, as variously described herein.

Further Example Embodiments

The following examples pertain to further embodiments, from which numerous permutations and configurations will be apparent.

Example 1 is a semiconductor integrated circuit, comprising: a channel region; a gate electrode above the channel region; a gate dielectric layer between the gate electrode and the channel region; a first layer between the gate dielectric layer and the gate electrode, the first layer comprising temperature compensation material; a source region adjacent to the channel region; a source metal contact on the source region; a drain region adjacent to the channel region; and a drain metal contact on the drain region.

Example 2 includes the subject matter of Example 1, wherein the first layer includes Rubidium (Rb).

Example 3 includes the subject matter of Examples 1 or 2, wherein first layer includes Caesium (Cs).

Example 4 includes the subject matter of any of Examples 1 to 3, wherein the first layer includes Iron (Fe).

Example 5 includes the subject matter of any of Examples 1 to 4, wherein the first layer includes Osmium (Os).

Example 6 includes the subject matter of Example 1, wherein the first layer includes one or more of Rubidium (Rb), Caesium (Cs), Iron (Fe), and Osmium (Os).

Example 7 includes the subject matter of Example 1, wherein the first layer includes Rubidium (Rb), Caesium (Cs), Iron (Fe), and Osmium (Os).

Example 8 includes the subject matter of Example 1, wherein the first layer includes hafnium zirconate ($HfZrO_2$).

Example 9 includes the subject matter of Example 8, wherein the first layer includes barium titanate ($BaTiO_3$).

Example 10 includes the subject matter of Examples 8 or 9, wherein the first layer includes bismuth ferrite ($BiFeO_3$).

Example 11 includes the subject matter of any of Examples 8 to 10, wherein the first layer includes lead zirconate titanate ($PbZr_xTi_{(1-x)}O_3$).

Example 12 includes the subject matter of any of Examples 8 to 11, wherein the first layer includes zinc oxide (ZnO).

Example 13 includes the subject matter of any of Examples 8 to 12, wherein the first layer includes potassium niobate ($KNbO_3$).

Example 14 includes the subject matter of any of Examples 8 to 13, wherein the first layer includes sodium tungstate ($Na_2WO_3$).

Example 15 includes the subject matter of any of Examples 8 to 14, wherein the first layer includes bismuth titanate ($Bi_4Ti_3O_{12}$).

Example 16 includes the subject matter of any of Examples 8 to 15, wherein the first layer includes gallium nitride (GaN).

Example 17 includes the subject matter of any of Examples 8 to 16, wherein the first layer includes aluminum nitride (AlN).

Example 18 includes the subject matter of Example 1, wherein the first layer includes one or more of hafnium zirconate ($HfZrO_2$), barium titanate ($BaTiO_3$), bismuth ferrite ($BiFeO_3$), lead zirconate titanate ($PbZr_xTi_{(1-x)}O_3$), zinc oxide (ZnO), potassium niobate ($KNbO_3$), sodium tungstate ($Na_2WO_3$), bismuth titanate ($Bi_4Ti_3O_{12}$), gallium nitride (GaN), and aluminum nitride (AlN).

Example 19 includes the subject matter of Example 1, wherein the first layer includes hafnium zirconate ($HfZrO_2$), barium titanate ($BaTiO_3$), bismuth ferrite ($BiFeO_3$), lead zirconate titanate ($PbZr_xTi_{(1-x)}O_3$), zinc oxide (ZnO), potassium niobate ($KNbO_3$), sodium tungstate ($Na_2WO_3$), bismuth titanate ($Bi_4Ti_3O_{12}$), gallium nitride (GaN), and aluminum nitride (AlN).

Example 20 includes the subject matter of any of Examples 1 to 19, wherein the first layer includes a plurality of layers.

Example 21 includes the subject matter of any of Examples 1 to 20, further including a second layer comprising at least one of tungsten (W), tantalum (Ta), and titanium nitride (TiN), the second layer between the gate dielectric layer and the first layer.

Example 22 includes the subject matter of any of Examples 1 to 21, wherein the gate electrode includes at least one of tungsten (W), copper (Cu), and aluminum (Al).

Example 23 includes the subject matter of any of Examples 1 to 22, wherein the channel region is part of a semiconductor body that extends above an underlying substrate, and the gate dielectric and gate electrode are adjacent multiple sides of the body so as to provide a double-gate or tri-gate structure.

Example 24 includes the subject matter of any of Examples 1 to 22, wherein the channel region is part of a semiconductor body that extends above an underlying substrate, and the gate dielectric and gate electrode are on all sides of the body so as to provide a gate-all-around structure.

Example 25 includes a computing device that includes the subject matter of any of Examples 1 to 24.

Example 26 includes a method for forming a semiconductor integrated circuit, the method comprising: forming a channel region; forming a gate structure, the gate structure including a gate electrode above the channel region, a gate dielectric layer between the gate electrode and the channel region, and a first layer between the gate dielectric layer and the gate electrode, the first layer comprising temperature compensation material; forming a source region adjacent to the channel region; forming a source metal contact on the source region; forming a drain region adjacent to the channel region; and forming a drain metal contact on the drain region.

Example 27 includes the subject matter of Example 26, wherein the first layer includes at least one of Rubidium (Rb), Caesium (Cs), Iron (Fe), and Osmium (Os).

Example 28 includes the subject matter of Example 26, wherein the first layer includes one or more of hafnium zirconate ($HfZrO_2$), barium titanate ($BaTiO_3$), bismuth ferrite ($BiFeO_3$), lead zirconate titanate ($PbZr_xTi_{(1-x)}O_3$), zinc oxide (ZnO), potassium niobate ($KNbO_3$), sodium tungstate ($Na_2WO_3$), bismuth titanate ($Bi_4Ti_3O_{12}$), gallium nitride (GaN), and aluminum nitride (AlN).

Example 29 includes the subject matter of any of Examples 26 to 28, further including forming a second layer comprising at least one of tungsten (W), tantalum (Ta), and titanium nitride (TiN), the second layer between the gate dielectric layer and the first layer.

Example 30 includes the subject matter of any of Examples 26 to 29, wherein the gate electrode includes at least one of tungsten (W), copper (Cu), and aluminum (Al).

The foregoing description of example embodiments has been presented for the purposes of illustration and description. It is not intended to be exhaustive or to limit the present disclosure to the precise forms disclosed. Many modifications and variations are possible in light of this disclosure. It is intended that the scope of the present disclosure be limited not by this detailed description, but rather by the claims appended hereto. Future filed applications claiming priority to this application may claim the disclosed subject matter in a different manner, and may generally include any set of one or more limitations as variously disclosed or otherwise demonstrated herein.

What is claimed is:

1. A semiconductor integrated circuit, comprising:
a semiconductor region;
a gate electrode above the semiconductor region;
a gate dielectric between the gate electrode and the semiconductor region;
a layer between the gate dielectric and the gate electrode, the layer comprising temperature compensation material;
a source region adjacent to the semiconductor region;
a first contact on the source region and including metal;
a drain region adjacent to the semiconductor region; and
a second contact on the drain region and including metal.

2. The semiconductor integrated circuit of claim 1, wherein the temperature compensation material includes Rubidium (Rb).

3. The semiconductor integrated circuit of claim 1, wherein the temperature compensation material includes Caesium (Cs).

4. The semiconductor integrated circuit of claim 1, wherein the temperature compensation material includes Iron (Fe).

5. The semiconductor integrated circuit of claim 1, wherein the temperature compensation material includes Osmium (Os).

6. The semiconductor integrated circuit of claim 1, wherein the temperature compensation material includes two or more of Rubidium (Rb), Caesium (Cs), Iron (Fe), and Osmium (Os).

7. The semiconductor integrated circuit of claim 1, wherein the temperature compensation material has one or more of a band structure, a work-function, and/or a polarization that changes in response to a change in temperature.

8. The semiconductor integrated circuit of claim 1, wherein the temperature compensation material includes one or more of hafnium zirconate ($HfZrO_2$), barium titanate ($BaTiO_3$), bismuth ferrite ($BiFeO_3$), lead zirconate titanate ($PbZr_xTi_{(1-x)}O_3$), zinc oxide (ZnO), potassium niobate ($KNbO_3$), sodium tungstate ($Na_2WO_3$), bismuth titanate ($Bi_4Ti_3O_{12}$), gallium nitride (GaN), and aluminum nitride (AlN).

9. The semiconductor integrated circuit of claim 1, wherein the temperature compensation material includes a ferroelectric material, the ferroelectric material including oxygen in addition to: hafnium and zirconium; barium and titanium; bismuth and iron; and/or lead, zirconium, and titanium.

10. The semiconductor integrated circuit of claim 1, wherein the layer includes a plurality of sub-layers.

11. The semiconductor integrated circuit of claim 1, wherein the layer is a first layer, the integrated circuit further including a second layer comprising at least one of tungsten (W), tantalum (Ta), and titanium nitride (TiN), the second layer between the gate dielectric and the first layer.

12. The semiconductor integrated circuit of claim 1, wherein the gate electrode includes at least one of tungsten (W), copper (Cu), and aluminum (Al).

13. The semiconductor integrated circuit of claim 1, wherein the semiconductor region is part of a semiconductor body, and the gate dielectric and gate electrode are adjacent multiple sides of the body so as to provide a double-gate or tri-gate structure.

14. The semiconductor integrated circuit of claim 1, wherein the semiconductor region is part of a semiconductor body, and the gate dielectric and gate electrode wrap around the body so as to provide a gate-all-around structure.

15. The semiconductor integrated circuit of claim 1, wherein the temperature compensation material includes a piezoelectric material, the piezoelectric material including oxygen in addition to: zinc; potassium and niobium; sodium and tungsten; and/or bismuth and titanium.

16. The semiconductor integrated circuit of claim 1, wherein the temperature compensation material includes a piezoelectric material, the piezoelectric material including nitrogen in addition to: gallium; and/or aluminum.

17. A semiconductor integrated circuit, comprising:
a semiconductor region;
a gate electrode above the semiconductor region;
a gate dielectric between the gate electrode and the semiconductor region;
a layer between the gate dielectric and the gate electrode, the layer comprising a temperature compensation material, the temperature compensation material including a ferroelectric or piezoelectric material;
a source region adjacent to the semiconductor region;
a first contact on the source region and including metal;

a drain region adjacent to the semiconductor region; and
a second contact on the drain region and including metal.

18. The semiconductor integrated circuit of claim 17, wherein the layer includes a plurality of sub-layers.

19. A semiconductor integrated circuit, comprising:
- a semiconductor region;
- a gate electrode above the semiconductor region;
- a gate dielectric between the gate electrode and the semiconductor region;
- a layer between the gate dielectric and the gate electrode, the layer comprising a temperature compensation material that has a band structure that changes in response to a change in temperature, the temperature compensation material including one or more of Rubidium (Rb), Caesium (Cs), Iron (Fe), and Osmium (Os);
- a source region adjacent to the semiconductor region;
- a first contact on the source region and including metal;
- a drain region adjacent to the semiconductor region; and
- a second contact on the drain region and including metal.

20. The semiconductor integrated circuit of claim 19, wherein the layer includes a plurality of sub-layers.

* * * * *